(12) United States Patent
Harpster et al.

(10) Patent No.: US 6,939,778 B2
(45) Date of Patent: Sep. 6, 2005

(54) METHOD OF JOINING AN INSULATOR ELEMENT TO A SUBSTRATE

(75) Inventors: Timothy J. Harpster, Ann Arbor, MI (US); Khalil Najafi, Ann Arbor, MI (US)

(73) Assignee: The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 10/417,299

(22) Filed: Apr. 16, 2003

(65) Prior Publication Data

US 2004/0029336 A1 Feb. 12, 2004

Related U.S. Application Data

(60) Provisional application No. 60/373,425, filed on Apr. 18, 2002.

(51) Int. Cl.$^7$ ................................................. H01L 21/76
(52) U.S. Cl. ..................... 438/406; 438/455; 438/457
(58) Field of Search ............................ 438/445–456, 438/612–618

(56) References Cited

U.S. PATENT DOCUMENTS

| | | |
|---|---|---|
| 3,397,278 A | 8/1968 | Pomerantz |
| 3,470,348 A | 9/1969 | Pomerantz et al. |
| 4,141,136 A | 2/1979 | Henry et al. |
| 4,452,624 A | 6/1984 | Wohltjen et al. |
| 4,701,424 A | 10/1987 | Mikkor |
| 4,810,671 A | 3/1989 | Bhattacharyya et al. |
| 4,927,505 A | 5/1990 | Sharma et al. |
| 5,227,250 A | 7/1993 | Bobal et al. |
| 5,286,671 A | 2/1994 | Kurtz et al. |
| 5,294,241 A | 3/1994 | Taylor et al. |
| 5,346,857 A | 9/1994 | Scharr et al. |
| 5,368,880 A | 11/1994 | McKee et al. |
| 5,682,065 A | 10/1997 | Farnworth et al. |
| 5,695,590 A * | 12/1997 | Willcox et al. .......... 156/272.2 |
| 5,709,724 A | 1/1998 | Naugler et al. |
| 5,837,562 A | 11/1998 | Cho |
| 5,989,372 A * | 11/1999 | Momoda et al. .......... 156/89.11 |
| 6,096,414 A | 8/2000 | Young |
| 6,131,410 A | 10/2000 | Swjerkowski et al. |
| 6,231,925 B1 | 5/2001 | Davlin |
| 6,274,252 B1 | 8/2001 | Naugler et al. |
| 6,346,305 B1 | 2/2002 | Ramsey et al. |
| 6,417,478 B1 * | 7/2002 | Shiraishi et al. .......... 219/78.02 |
| 6,475,326 B2 * | 11/2002 | Gross ....................... 156/272.2 |

OTHER PUBLICATIONS

Weichel, Steen, et al., Silicon–To–Silicon Wafer Bonding Using Evaporated Glass, Denmark, Elsevier Science S.A., Sensors & Actuators vol. A–70, No. 1–2, Oct. 1, 1998, pp. 179–184.

Lee, Thomas M.H., et al., An Improved Anodic Bonding Process Using Pulsed Voltage Technique, Journal of Microelectromechanical Systems, vol. 9, No. 4, Dec. 2000, pp. 469–473.

Gerlach, A., et al., Low–Temperature Anodic Bonding Of Silicon Wafers By Means Of Intermediate Glass Layers, Microsystem Technologies, vol. 5, No. 3, Feb. 1999, pp. 144–149.

Katz, A., et al., In Situ Stress Measurements of Gold Films On Glass Substrates During Thermal Cycling, J. Appl. Phys. vol. 70, No. 12, Dec. 14, 1991, pp. 7342–7348.

* cited by examiner

*Primary Examiner*—Dung A. Le
(74) *Attorney, Agent, or Firm*—Brooks Kushman, P.C.

(57) ABSTRACT

Bonding methods and articles produced thereby are provided wherein an insulator, such as glass, is bonded to a solder with the assistance of an electric field.

14 Claims, 2 Drawing Sheets

METHOD OF JOINING AN INSULATOR ELEMENT TO A SUBSTRATE

CROSS-REFERENCE TO RELATED APPLICATION

This application claims the benefit of U.S. provisional application Ser. No. 60/373,425, filed Apr. 18, 2002 and entitled "Field Assisted Bonding of Insulator to Eutectic Solder," which is hereby incorporated in its entirety by reference herein.

STATEMENT REGARDING FEDERALLY SPONSORED RESEARCH OR DEVELOPMENT

This invention was made with Government support under Contract No. EEC-9986866 awarded by NSF-ERC. The Government has certain rights to the invention.

BACKGROUND OF THE INVENTION

1. Field of the Invention

This invention relates to bonding methods and articles produced thereby.

2. Background Art

Micromachined sensors, actuators, microinstruments, and microsystem have made significant progress during the past two decades and many prototype devices have been demonstrated for a number of different applications. Many other devices have been successfully commercialized, including pressure sensors for automotive and industrial processing applications, and more recently accelerometers for automotive and consumer applications. Other devices are also finding their way into large volume commercial markets, such as MEMS for optical communication systems (sometimes referred to as micro-opto-electro-mechanical-systems or MOEMS), MEMS for wireless RF communication systems (RF MEMS), and the increasingly growing area of biomedical microsystems (BioMEMS). Other emerging applications include micro power generation systems, environmental monitoring systems, microsystems for industrial process control, health care, and consumer applications. While these application require a variety of different sensors, actuators, low-power interface and signal processing circuits, and wireless interfaces, they all share the need for reliable, stable, and robust packaging technologies. Packaging has been one of the most costly and least developed aspects of a microsystem, and often plays a detrimental effect on overall device performance. Much of the packaging technologies developed for commercialized devices has relied on adapting already existing technologies previously developed for integrated circuits. These technologies have been useful in some MEMS devices, including accelerometers, which require relatively simple techniques. The main shortcoming of many of these technologies is the fact that they are applied to individual devices, typically at the end of the fabrication process after the devices are diced apart from their host wafer. This requires individual handling of the final device in order to incorporate the package into its final intended package. This individual handling increases the chances of damage to the device, has a negative influence on device performance, and most importantly increases the cost. Therefore, attention has increasingly been focused on developing new technologies that can be applied at the wafer level, usually before the device is separated from the host wafer.

Because of the diversity of applications, device structures, and requirements for MEMS and microsystems, a variety of packaging and interconnect techniques have to be developed to meet the requirements of these applications.

There are several key technological challenges in packaging of microsystems. These can be categorized under three general topics of: transducer encapsulation (protection), connection, and assembly as listed in Table 1. Packaging of MEMS is different than packaging of other standard microelectronic components because MEMS by their nature require direct interaction with their surrounding environment. As a result, the device cannot be physically isolated from the surrounding environment and selective access needs to be provided to the sensing/actuating part of the MEMS device. This creates a significant problem for the package, since the package has to protect the device while providing access to the environment the device is supposed to interact with, simultaneously. As a result, a lot of effort has been expended on developing the proper protection/encapsulation medium for MEMS. Two general approaches have been taken: the first depends on a package in the form of a shell or capsule that can be bonded to the device substrate; and the second relies on using a thin film material that protects the regions that need protection, while providing access to those that need to interact with the external environment. In either case, the packaging has to satisfy certain requirements.

TABLE 1

Key Technological Requirements in Packaging and Assembly of Integrated Microsystems

| Encapsulation/Protection | Connection | Assembly |
| --- | --- | --- |
| Shells, Thin Films | Reconfigurable | Modularized |
| Selective Exposure | Electrical/Fluidic/Optical | Removable |
| Wafer-Level, small | Sealed/Buffered Feedthroughs | Standardized |
| Hermetic, or Vacuum-Sealed | Cables, Spring Contacts | Reconfigurable |
| Corrosion Resistant, Media-Compatible | Low Parasitics (R, C, L), Small | Reusable |
| Long-term stability, reliability, uniformity, reproducibility, and long-term testing | | |

The most important requirement is that the package can be applied at the wafer level before the devices are diced apart from their host wafer. This wafer level approach not only reduces cost, but also protects the device during the subsequent process steps, such as cleaning and dicing that often damage the delicate MEMS device. The package needs to be as small as possible, dictated either by the requirement for low-cost or by the application area itself that often requires a small size for proper operation. The package has to provide a hermetically-sealed environment, and in some instances a vacuum medium that is stable over many years, such as is required in resonant devices. The package should be resistant to harsh media the MEMS operate in, but it additionally needs to be compatible with the media it operates in and not cause any damage to that media, as for example in biomedical applications where the package has to be biocompatible. This last requirement is often overlooked, but frequently has significant implications for the process technologies and materials used since it limits the range of materials and processes that can be used to implement the package.

The second category of techniques that need to be developed for packaging of MEMS and microsystems is that of connection. As mentioned before, MEMS packages have to be capable of providing access to the environment with which the sensor/actuator interact. This means that the package has to be capable of providing sealed and reliable feedthroughs between the sensor/actuator, that are typically outside of the package and in direct exposure to the surrounding media, and devices/electronics that are sealed inside the package. In addition, once packaged, the MEMS devices have to have interconnections that transfer signals from the device to the outside world. It is important to note there that interconnects are not only for electrical signals but also for other types of signals such as optical, fluidic, and chemical signals. So, one has to be able to pass a variety of signals to and from the device after it has been packaged. The most suitable interconnection techniques are those that can be easily reconfigured and reused for different applications. It is desirable that interconnects are easily removed and reused as the device is used in different microsystems. The connection should not degrade the signal quality and have low parasitics (such as resistance, capacitance, or inductance), and it should be as small as possible for obvious reasons. Interconnections and feedthroughs are often ignored when a packaging technology is developed for MEMS, but usually end up being one of the most important aspects of the package because they are either very large, or cause device failure.

The third category of techniques required for packaging of microsystems is that of assembly. This area is also often overlooked but becomes increasingly critical when developing microsystems that combine a number of different chips and modules. One simple example of assembly is when the MEMS chip is to be connected to a circuit chip. This has historically been done by placing both substrates on a common board, often a printed circuit board that has the required traces to transmit signals from one chip to the other. Wire bonding is then used to interconnect pads on the MEMS/IC chip to the traces on the board. In many emerging microsystems, however, this approach is neither sufficient nor practical. These microsystems usually contain more than two substrates and they have to occupy a very small volume. Therefore, the assembly and interconnect approaches chosen have to be compatible with small size, and flexibility often required by a given application. In addition, cost is a critical factor and needs to be kept as small as possible. Therefore, it is vital that assembly techniques that are reliable, modular, and reconfigurable be developed. It is advantageous if a set of standards can be developed for a variety of device substrates, so that independent of the device type, the shape and input/output (IO) pad layout is such that they can all be assembled together using a standard mechanism. Many multi-chip systems are assembled together without any possibility of reconfigurability and re-work. If the assembly technique is re-workable, meaning that after assembly the individual units can be pulled apart and reassembled again without the loss of performance or yield, and if the physical layouts and dimensions are standardized, the overall cost of microsystems could be significantly reduced. Modularity is another desirable feature of future microsystem assembly technologies. This means that different chips can be assembly together in a modular fashion, so that one can be taken out and replaced with another without the need for developing a whole new set of hardware. Therefore, where possible, assembly structures and interfaces need to be standardized, use techniques that are amenable to re-work and multiple connect/disconnect cycles, be small, and be compatible with a variety of device types and technologies.

In all of these areas, the need for low cost and small packaging technologies that can be integrated with the devices and microsystems being developed is paramount and often determines whether a given approach is successful or not. In order to satisfy many of these requirements, microfabrication and micromachining technologies, such as those developed for MEMS, have to be used, and seamlessly integrated with the overall fabrication process of the microsystem.

Packaging Using Capsules or Shells

As mentioned above, the package needs to protect the sensitive parts of MEMS while allowing selective access to those parts that need to be in contact with the medium being monitored. One way to provide such protection is based on using a physical shell or capsule 10 that can be placed over the sensitive parts or devices 13, while feedthroughs 14 are passed through the package to connect to other components that are in contact with the medium, as illustrated in FIG. 1. The capsule 10 is bonded to an insulating layer 15 formed on a substrate 11 at bond regions 12. The devices 13 are positioned in the resulting hermetic/vacuum cavity.

The capsule 10 can be fabricated from a variety of materials, including metals, like a metal can or enclosure, glass/ceramic, silicon, or other semiconductor materials. It is often fabricated as an individual or separate piece that is applied to the MEMS part. This individual handling is not desirable because it increases the cost and also exposes the MEMS part to process steps that can potentially damage or compromise the part. It is, therefore, desirable that the package capsule be fabricated at the wafer level before the MEMS parts are diced apart from their host wafer, and that the package wafer is bonded to the device wafer using a reliable technique. Therefore, the area where the package and the device substrate are attached is an important area, and a reliable bonding technique should be utilized to achieve a permanent seal between the package and the substrate. To do this, a variety of bonding techniques have been utilized. These bonding techniques include silicon-glass bonding, glass frit bonding, eutectic or solder bonding, and a variety of other bonding techniques. The advantages of a package capsule is that it can provide a very reliable and long-term stable hermetic or vacuum environment since these packages are quite resistant to permeation by various gases or environmental parameters such as moisture. Another important aspect of the package is the feedthroughs needed to transfer signals from sensors/actuators outside of the package to the devices and circuits inside the package cavity. FIG. 1 shows an examples of lateral (or on wafer) feedthroughs. It is possible to also fabricate vertical (or through wafer) feedthroughs. In either case, the feedthrough has to have low parasitics (resistance or capacitance) and has to be an integral part of the overall package and be sealed to avoid any leakage. Feedthroughs are often a primary source of failure in many packages.

Packaging approaches based on capsules and shells bonded to a device substrate are discussed below.

Silicon-Glass Packages Based on Anodic (Electrostatic) Bonding

One of the most widely used bonding techniques in MEMS is that of bonding between a glass wafer/structure made of Pyrex 7440 glass and a polished silicon substrate through a process called electrostatic, or anodic, bonding. Electrostatic bonding of glass and silicon wafers has long been used for the fabrication of a variety of silicon-based sensors. This bonding can be achieved when two polished wafers of silicon and glass are brought into intimate contact and a high voltage is applied across this sandwich to create a permanent chemical bond. The glass-silicon sandwich is heated to temperatures of about 300–400° C., which tends to soften the glass and lower its electrical resistivity, and a DC voltage of 800–1500V is applied across the glass-silicon combination. This voltage generates a very high electrostatic attractive force, which pulls the silicon and the glass into intimate contact, thus promoting and creating a chemical bond. Once the bond is complete, the structure is cooled down to room temperature. The bond is achieved between Si and $O_2$ atoms and is created by the high temperature and the extreme attractive force generated by the electrostatic voltage. The Si—O bond is stronger than the Si—Si bond, and is stronger than the glass. In order to minimize intrinsic stresses generated within the structure and at the silicon-glass interface, the thermal expansion coefficients of the glass and silicon have to be as nearly matched as possible. Therefore, Pyrex glass code #7740 is often used for silicon-glass bonding applications since this glass not only has an expansion coefficient very close to that of silicon, but it has a low softening point that helps lower the bonding temperature. In order to ensure a high quality bond, the surfaces of both the silicon and the glass have to be polished and free of any scratches and defects.

Using glass as a package shell has several advantages. First, it is transparent to light and RF signals, and therefore, it can be use din MOEMS as well as biomedical applications where a radio frequency signal has to be transmitted to the devices protected under the shell. Additionally, Pyrex glass is biocompatible, and is resistant to many common corrosive environments, such as salt water and humidity. The technology for making glass wafers is quite established, and the material can be obtained at low cost. There already exists extensive experience with using this glass-silicon bonding in manufacturing many sensor structures, such as pressure sensors and accelerometers. This technology has been used to develop a miniature package for bio-MEMS devices with high density multiple feedthroughs. This packaging technology utilizes electrostatic bonding of a custom-made glass capsule to a silicon substrate to form a hermetically sealed cavity.

Packaging Using Solders and Eutectic Bonding

In addition to anodic silicon-glass bonding, a number of other bonding techniques have also been used for packaging, including silicon-gold eutectic bonding, glass frit bonding, fusion bonding, and bonding using evaporated glass. One of the most commonly used wafer bonding techniques is based on solder or eutectic bonding. In its simplest form, a solder of a suitable material set can be formed in the bond area between a package and device substrates. The two substrates are brought together and the temperature is raised until the solder flows and creates a bond between the two substrates. The most obvious material to use is standard solder used in microelectronic applications. However, the shortcoming of many of these solder materials is that they contain either flux or sufficient impurities to cause them to have significant outgassing during the reflow process. This creates a major problem when trying to use this technique for vacuum packaging. Recent work on using new fluxless solder materials can overcome this problem and several groups are pursuing this. Instead of standard solder, it is also possible to use alloys of different materials in the form of eutectic solder. One of the most common material sets has been the eutectic of gold and silicon. Silicon-gold eutectic is quite attractive because it is formed at a temperature of 363° C. with one part silicon and four parts gold. These materials are commonly used in MEMS fabrication and when the eutectic is formed, outgassing is not a problem since the mixture is simply formed by raising the temperature and the starting materials are pure. In addition, the temperature is low enough for most applications.

Although Au—Si eutectic has long been used for wafer bonding and packaging, few have reported its successful use in vacuum packaging. There are several reasons for this, including non-uniform eutectic flow, void formation, insufficient eutectic material in between wafers causing non-uniform bonding, oxidation of bond surfaces, and poor surface contact/adhesion. Furthermore, few published reports have presented data showing full wafer-level bonding. The main problem with Au—Si eutectic bonding has been a lack of uniformity over an entire wafer, and lack of reproducibility from wafer-to-wafer.

Gold-silicon eutectic formation occurs at 363° C. for 19 at % Si. The eutectic can be used to bond two wafers, or be used for hermetic and vacuum packaging. To form the eutectic, silicon and gold have to be provided to the interface where two wafers are bonded. Typically, the gold is deposited on one of the wafers to the desired thickness, and the silicon is provided either from the bulk of one of the wafers, or from thin films deposited on one or both wafers. For example, a device wafer containing feedthroughs and a top polysilicon layer, and a cap wafer containing a package cavity and an electroplated bond ring may be provided. When the two wafers are brought into contact and heated to above 363° C., silicon is supplied from both the cap wafer (underneath the gold ring), and the device wafer (the polysilicon layer) and will react with gold to initiate the eutectic liquid formation. Upon cooling, the bond consists of Au—Si hypereutectic phase and represents a typical strong diffusional bond.

Different wafers with a different set of materials and bonding layers have been bonded together. The material sets include: Si/Ti/Au to Au/Ti/Si; Si/Ti/Au to Si; Si/Ti/Au to PolySi/Si; Si/Ti/Au to Oxide/Si; and Si/Ti/Au to Nitride/Si. Of these wafers, it has been discovered that the bond quality and uniformity between Au—Au, Au—Si, and Au-PolySi is the best. In particular, it is noted that the bond quality is best when the gold and silicon are supplied from the two wafers, instead of both from the same wafer. Test wafers where the Au—Si eutectic was bonded to a substrate covered with either oxide or nitride produced very non-uniform and poor bonds.

One of the main problems with using Si—Au eutectic as a bonding medium between wafers has been the lack of uniformity and reproducibility. There are many reasons for this as mentioned before. In order to achieve good uniformity and reproducibility, the Au—Si eutectic bond should be conducted: (a) in a vacuum or inert gas ambient to avoid further oxidation at high temperature; (b) the bonding surface should be kept clean and free of any contaminants; (c) some contact force should be applied on the wafers to provide an intimate contact between the bonding materials of Au and polysilicon; (d) the bonded wafers should be cooled down as fast as possible around the eutectic temperature; (e) in order to provide sufficient Au—Si eutectic, the thickness of the eutectic material should be several microns so when the wafers are pressed together, eutectic can cover over non-planar surfaces; and (f) the wafers should be properly baked to minimize outgassing.

As mentioned above, the silicon-gold eutectic bonding requires that the surfaces be prepared and cleaned well. In addition, it is important that during the bonding process, the gold and silicon are supplied from the two wafers, so that the interdiffusion of the two materials creates an intimate contact to both surfaces. It has also been mentioned that the bond quality of an Si—Au eutectic-to-silicon oxide, nitride, or glass is typically not very good and non-uniform.

The following prior art references are related to the present invention:

1. A. Katz et al., "In Situ Stress Measurements of Gold Films on Glass Substrates During Thermal Cycling," J. APPL. PHYS., Vol 70, No. 12, December 1991, pp. 7342–7348.

2. U.S. Pat. No. 3,397,278, Daniel I. Pomerantz, "Anodic Bonding," P. R. Mallory and Co., Inc., Aug. 13, 1968.

3. U.S. Pat. No. 3,470,348, Daniel I. Pomerantz, "Anodic Bonding of Liquid Metals to Insulators," P. R. Mallory and Co., Inc., Sep. 30, 1969.

4. U.S. Pat. No. 4,452,624, Henry Wohltjen et al., "Method for Bonding Insulator to Insulator," Secretary of the Navy, Jun. 5, 1984.

5. U.S. Pat. No. 5,837,562, Steve T. Cho, "Process for Bonding a Shell to a Substrate for Packaging a Semiconductor," Charles Stark Draper Laboratory, Nov. 17, 1998.

6. U.S. Pat. No. 5,346,857, Thomas A. Scharr, "Method for Forming a Flip-Chip Bond From a Gold-Tin Eutectic," Motorola, Sep. 13, 1994.

7. U.S. Pat. No. 4,927,505, Ravinder K. Sharma, "Metalization Scheme Providing Adhesion and Barrier Properties," Motorola, May 22, 1990.

8. U.S. Pat. No. 5,709,724, Robert E. Naugler, "Process for Fabricating Hermetic Glass-to-Metal Seal," Coors Ceramics Co., Jan. 20, 1998.

9. U.S. Pat. No. 6,274,252, Robert E. Naugler, "Hermetic Glass-to-Metal Seal Useful in Headers for Airbags," Coors Ceramics Co., Aug. 14, 2001.

10. U.S. Pat. No. 6,231,926, Anthony O. Davlin, "Method for Adhering Precious Metal to Vitreous Substances," No Assignee, May 15, 2001.

11. U.S. Pat. No. 4,141,136, Raymond Henry, "Method of Fabricating Semiconductor Devices with a Low Thermal Resistance and Devices Obtained by the Method," Thompson-CSF, Feb. 27, 1979.

12. U.S. Pat. No. 6,096,414, Kent M. Young, "High Dielectric Strength Thermal Interface Material," Parker-Hannifin Corporation, Aug. 1, 2000.

13. U.S. Pat. No. 6,346,305, Michael J. Ramsey, "Low Temperature Material Bonding Technique," UT-Battelle, Feb. 12, 2002.

14. U.S. Pat. No. 5,227,250, Thomas A. Bobal, "Glass-to-Metal Seal," Fifth Dimension, Inc., Jul. 13, 1993.

15. U.S. Pat. No. 5,294,2441, William J. Taylor, "Method for Making Glass-to-Metal Seals," Medtronic, Inc., Mar. 15, 1994.

16. U.S. Pat. No. 4,927,505, Ravinder K. Sharma, "Metallization Scheme Providing Adhesion and Barrier Properties," Motorola, Inc., May 22, 1990.

17. U.S. Pat. No. 4,701,424, Mati Mikkor, "Hermetic Sealing of Silicon," Ford Motor Co., Oct. 20, 1987.

18. U.S. Pat. No. 5,368,880, Richard c. McKee, "Eutectic Bond and Method of Gold/Titanium Eutectic Bonding of Cadmium Telluride to Sapphire," Westinghouse Electric Corporation, Nov. 29, 1994.

19. U.S. Pat. No. 4,810,671, Bidyut K. Bhattacharyya, "Process for Bonding Die to Substrate Using a Gold/Silicon Seed," Intel Corporation, Mar. 7, 1989.

20. U.S. Pat. No. 5,682,065, Warren M. Farnworth, "Hermetic Chip and Method of Manufacture," micron Technology, Inc., Oct. 28, 1997.

21. U.S. Pat. No. 5,286,671, Anthony D. Kurtz, "Fusion Bonding Technique for use in Fabricating Semiconductor Devices," Kulite Semiconductor Products, Inc., Feb. 15, 1994.

22. U.S. Pat. No. 6,131,410, Steve P. Swierkowski, "Vacuum Fusion Bonding of Glass Plates," The Regents of the University of California, Oct. 17, 2000.

23. Steen Weichel et al., "Silicon-Silicon Wafer Bonding Using Evaporated Glass," SENSORS AND ACTUATORS, Vol. A70, No. 1–2; 1 Oct. 1998; p. 179–84.

24. A. Gerlach et al., "Low-Temperature Anodic Bonding of Silicon-to-Silicon Wafers By Means of Intermediate Glass Layers," MICROSYSTEM-TECHNOLOGIES, Vol. 5, No. 3; February 1999, p. 144–9.

25. Thomas M. Lee et al., "An Improved Anodic Bonding Process Using Pulsed Voltage Technique," JMEMS, Vol. 9, No. 4, December 2000, pp. 469–473.

SUMMARY OF THE INVENTION

An object of the present invention is to provide improved bonding methods and articles produced wherein an insulator, such as glass, is bonded to a solder with the assistance of an electric field.

In carrying out the above object and other objects of the present invention, a method for bonding a solder to an insulator is provided. The method includes the steps of: a) placing a molten solder in close surface contact with an insulator element; b) heating the insulator element to render the insulator element electrically conductive; and c) applying a potential across the solder and the insulator element to create an electrostatic field which chemically bonds the molten solder to the insulator element.

The insulator element may be a glass element.

The solder may have a silicon component.

The solder may be a silicon-gold solder.

Further in carrying out the above object and other objects of the present invention, a method of joining an insulator element to a substrate with a solder therebetween is provided. The method includes migrating ions in the insulator element towards a bond interface with a molten solder to oxidize a component of the molten solder to form a chemical bond.

The insulator element may be a glass element.

The substrate may be a silicon substrate.

The component of the solder may be silicon.

The method may further include placing a source of silicon in close surface contact with the solder to provide a silicon component of the solder.

The substrate may be a silicon substrate and the source of silicon may be the silicon substrate.

The source of silicon may be a polysilicon layer between the insulator and the substrate.

The solder may be a silicon-gold solder.

The insulator element may be a glass wafer and the substrate may be a silicon wafer.

The method may further include placing a source of silicon in close surface contact with a layer of metal between the insulator element and the substrate and heating the source of silicon and the layer of metal until silicon from the source alloys with the metal to form the solder.

The substrate may be a silicon substrate and the source of silicon may be the silicon substrate.

The source of silicon may be a polysilicon layer between the substrate and the insulator element.

The method may further include forming feedthroughs on the substrate.

Still further in carrying out the above object and other objects of the present invention, a method of joining an insulator element having a solder chemically bonded thereto to a substrate also having a solder chemically bonded thereto is provided. The method includes placing the solders in close surface contact with one another. The solders are heated until the solders are both molten. The solders are then cooled until the molten solders solidify.

Yet still further in carrying out the above object and other objects of the present invention, an article of manufacture is provided. The article includes an insulator having normally high resistivity but being conductive at elevated temperatures, and an electrically conductive solder including a metal component chemically bonded to the insulator at a bond interface therebetween by oxidation.

Further still in carrying out the above object and other objects of the present invention, an article of manufacture is provided which includes an insulator having a normally high resistivity but being conductive at elevated temperatures and a substrate. An electrically conductive solder includes a metal component chemically bonded to the insulator at a bond interface therebetween by oxidation, and the solder bonds the insulator to the substrate.

The insulator may be a glass wafer and the substrate may be a semiconductor wafer.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIG. 2d is a side view of the cooled wafers and solidified solder with both force and bias removed;

DETAILED DESCRIPTION OF THE PREFERRED EMBODIMENTS

In general, the present invention is based on both eutectic and anodic bonding. It is found that by applying an anodic bias, as is typically used in direct Si-glass wafer bonding, in a standard eutectic bond, one can obtain a significant improvement in bond quality, uniformity, and reproducibility. This new technique makes three very significant contributions to wafer bonding: 1) The electrostatic forces will ensure intimate contact between the eutectic solder and glass interface uniformly over large areas, which is necessary for wafer-level bonding and hermetic sealing; 2) A roadblock in obtaining hermetic and vacuum sealing using electrostatic methods is planarization of the bonding interfaces. The molten eutectic solder ensures instant and contiguous planarization over non-planar substructures such as electrical feedthroughs; and 3) All of the bonding materials are biocompatible which open the arena for biomedical applications.

Figure 1:
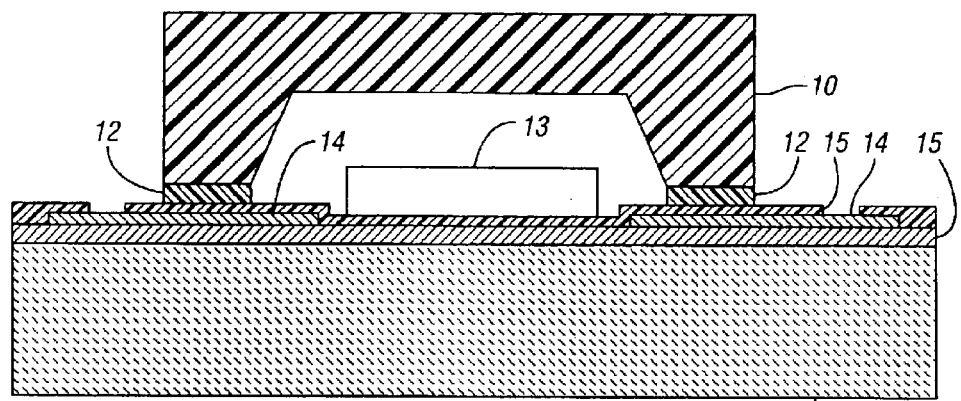
FIG. 1 is a side schematic view of packaging using a capsule or shell; the figure shows three important aspects of the package: the capsule, feedthroughs for signal transfer, and the bonding medium between the package and the substrate.
Figure 2A:
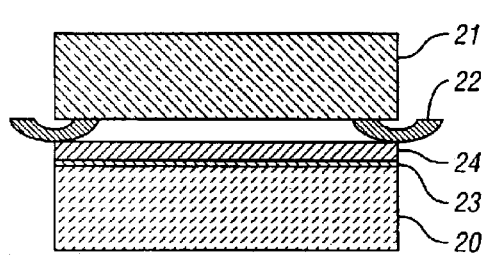
FIG. 2a is a side view of wafers placed in a bonder (not shown) with spacer flags therebetween.
Figure 2C:
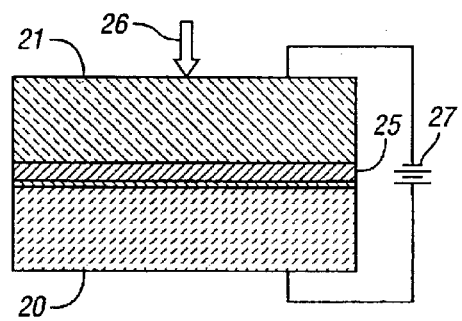
FIG. 2c is a side view of the wafers and eutectic solder (with spacer flags removed) all in contact with force and electrostatic bias applied.
Figure 2B:
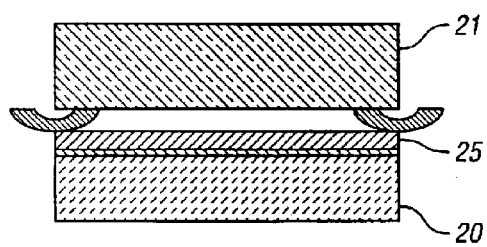
FIG. 2b is a side view of the wafers of FIG. 2a being heated until silicon from the silicon wafer alloys with the gold layer thereby forming a eutectic solder.
Figure 2B:
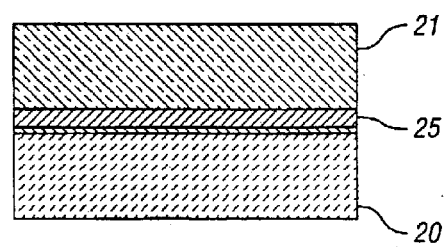

One embodiment of the bonding process of the present invention is illustrated in FIGS. 2a–2d. A Ti/Au 200 Å/10,000 Å layer (i.e., 23 and 24, respectively) is evaporated onto the silicon wafer 20. A glass wafer 21 and gold surface 24, on the Si wafer 20, are separated by ~500 $\mu$m flags 22 and then placed in an Electronic Visions electrostatic bonder. The wafers 20 and 21 are heated to 350° C. The air-filled chamber is evacuated to a pressure of 90 $\mu$Torr. The wafers 20 and 21 are heated further to 400° C. whereby the Si and Au 24 interdiffuse to form Si—Au eutectic liquid solder 25, as shown in FIG. 2b.

The wafers 20 and 21 are brought into contact with a 100N force 26, as shown in FIG. 2c. A voltage 27 of 100V for 1 minute, 500V for 5 minutes, and 1000V for 5 minutes is applied between the silicon wafer 20 and the Pyrex wafer 21. The voltage 27 is removed in FIG. 2d; the chamber is vented to 1 atmosphere and cooled to room temperature. After the wafers 20 and 21 cool to 350° C., ensuring that the solder 25 is resolidified, the 100N force 26 is removed.

The resulting bond between the glass 21, thin-film solder 25 and the silicon wafer 20 is very strong and uniform and the wafers 20 and 21 cannot be separated.

The bonding mechanism of this invention is described in the following. At elevated temperature, Na$^+$ ions in the Pyrex glass become mobile. When a voltage is applied to the wafer stack, the Na$^+$ ions drift toward the cathode leaving behind a space charge region of fixed O$^-$ ions in the glass near the bond interface. This, in turn, attracts an equivalent positive image charge in the Si—Au solder creating a large electric field. It is theorized that under this large electric field, the O$^-$ ions drift toward the interface and oxidize the Si in the solder. The chemical nature of anodically-bonded materials to glass is oxidation of the mated surface via ionized O$^-$ atoms freed by the mobile alkali metals ions—in this case Na$^+$ ions freed from Na$_2$O.

Alternative Processing

The bonding procedure outlined above with respect to the first embodiment may be altered in many ways to optimize the glass-solder bond or to create different bonding topologies. The succeeding sections will describe alternative processing methods that may be employed utilizing the teachings of the present invention.

Si Source

Figure 3:
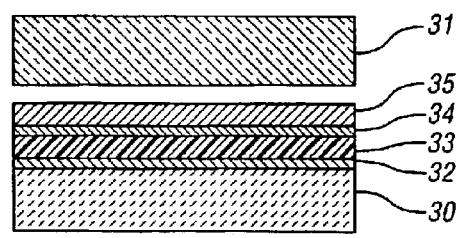
FIG. 3 is a side view of a pair of wafers and a polysilicon source for the eutectic solder.

As described above with respect to the first embodiment, the bare silicon wafer 20 provides the source of Si in the Si—Au eutectic solder 25. However, many methods may be employed to provide silicon for the solder. As shown in FIG. 3, a substrate 30 and a glass wafer 31 are shown. A polysilicon layer 33 over top underlying layers such as a dielectric 32 may be deposited followed by the tin-gold deposition (i.e., 34 and 35, respectively). When heated above the eutectic temperature, the same dissolution effect will take place and form a solder.

The Si—Au layer may also be directly deposited onto the substrate (with or without adhesion layers) using thin film deposition techniques, for example, direct sputtering or co-evaporation of Si—Au solder.

Gold Deposition

As described above with respect to the first embodiment, a 1 μm Au layer is deposited on silicon with a 200 Å Ti adhesion layer. An adhesion layer is not necessary depending on post deposition processes. If an adhesion layer is desired, then other adhesion layers can also be used. As an example, Cr is widely used as an Au adhesion layer.

Figure 4:
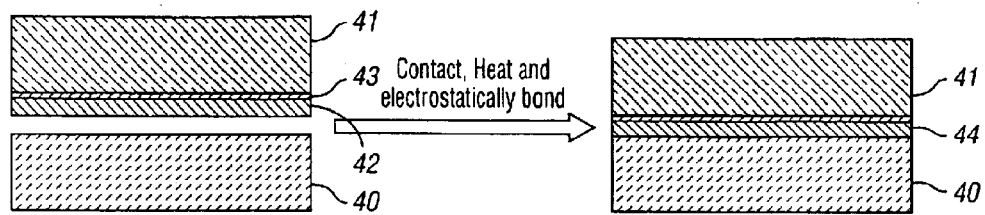
FIG. 4 is a side schematic process flow view showing deposition of a gold film to glass for electrostatic bonding of glass to Si—Au eutectic solder.

As shown in FIG. 4, an Au layer 42 may be deposited on a surface of a glass substrate 41, with or without an adhesion layer, such as tin layer 43, and contacted to the silicon wafer 40, heated to form the eutectic solder 44 and electrostatically bonded. This may avoid process complications including Au deposition on the silicon wafer.

Different Au thicknesses may be used. Different thickness layers of either the adhesion layer or the Au layer may affect the bond quality. Different thicknesses may affect Si diffusion into the Au and solder stresses and thus bond quality.

Different solders may also be employed. Other solders to be used in this bonding scheme may contain an oxidizing species. One such solder may be Au—Sn. This solder is particularly advantageous because the Au—Sn solder has a lower eutectic temperature. This would likely lower the entire process temperature, which is desired for thermal sensitive applications such as packaging of IC circuits and polymer films used in MEMS.

Glass Source

As described above with respect to the first embodiment, a Pyrex 7740 750 μm thick glass wafer was used to bond to the Si—Au solder. It has been shown that many different types of alkali metal glasses can be used for anodic bonding; some examples include Schott 8329, Schott 8330 (both alternative glasses containing sodium), and Itb 1060 (a glass containing lithium). Pyrex 7740 is widely used because, when bonded together at ~350° C., the structure will exhibit virtually no stress at room temperature; that is, the tensile stress that develops in the silicon at higher temperatures (larger than 150° C.) will be compensated by the compressive stress that develops at lower temperatures (smaller than 130° C.).

Glasses may be deposited onto various substrate materials via thin film deposition techniques. These glass-coated substrates can then be electrostatically bonded to the solder. This may be useful for Si—Si substrate bonding, or BeO and $AlO_3$ substrate bonding for use as thermal heat sinks for high power circuits.

Figure 5:
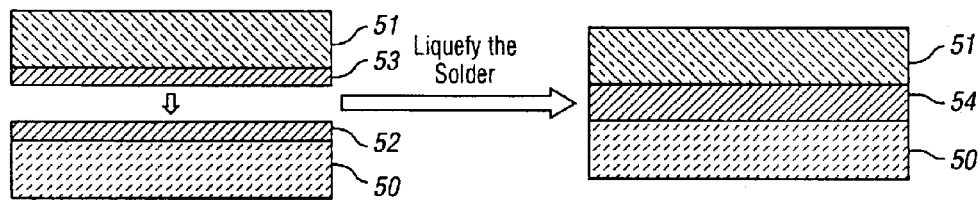
FIG. 5 is a side schematic process flow view showing low temperature glass-to-glass bonding using anodically-bonded solder.

Another possible utility is low temperature glass-glass bonding using a glass-solder to solder-glass process, as shown in FIG. 5. A eutectic solder 52 and 53 is anodically bonded to two glass substrates 50 and 51, respectively. The individual substrates 50 and 51 are heated to reflow the solder and mated. The materials are cooled resolidifying solder 54 resulting in two bonded glass substrates 50 and 51.

Temperature

The effects of temperature ramping for both heating and cooling have not been metered. Based on previous work, the temperature ramping procedure will most likely prove to be a significant role in increasing bond uniformity, and minimizing residual stress. Also, the lowest temperature to achieve a quality bond are sought out in order to avoid complications of high temperatures on preprocessed local structures.

Gaseous Environment

The effects of the air environment in the bonding chamber have not been metered. The ambient oxygen may interfere with the bond quality by causing oxidation of the silicon in the solder. Either a lower pressure vacuum or the presence of a noble gas may be desirable for optimizing bond quality.

Mechanical Force

As described above with respect to the first embodiment, a 100 N force 26 was applied to provide initial contact between the glass 21 and Si wafer 20. This applied force 26 may affect the bond quality. The electrostatic forces between the glass 21 and solder 25 may be much larger than the applied mechanical force 26 and thus increasing the mechanical load will not improve bond quality. However, there may be an optimized minimum force to establish initial contact.

Voltage-Current

There are many parameters of the applied bias that can be varied to optimize the bond quality. The bond quality is expected to improve with applied current density and time. However, minimal improvements may be attained beyond some current-time product. Some researchers have shown pulsed voltage anodic bonding to improve bond quality between Pyrex 7740 and silicon layers. Additionally, the procedure of when the voltage should be applied, before or after the solder liquefies, as well as, when the voltage should be removed, before of after the solder solidifies, may affect bond quality.

Bonding Scheme

Figure 6:
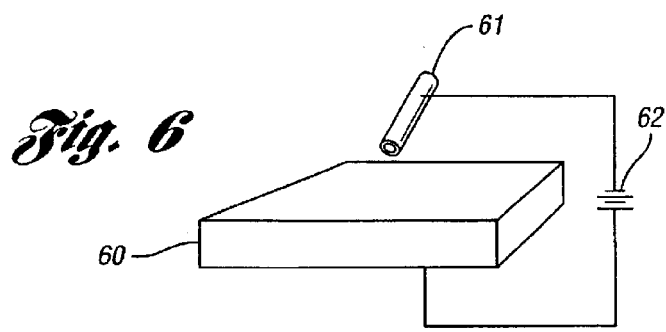
FIG. 6 is a schematic perspective view which illustrates direct writing of solder to a glass substrate.

The illustration in FIG. 6 shows a directing writing scheme of how the solder may be anodically (via voltage source 62) bonded to a glass substrate 60. Both the glass substrate 60 and a solder syringe 61 are heated above the eutectic temperature of the solder.

Figures 7A, 7B:
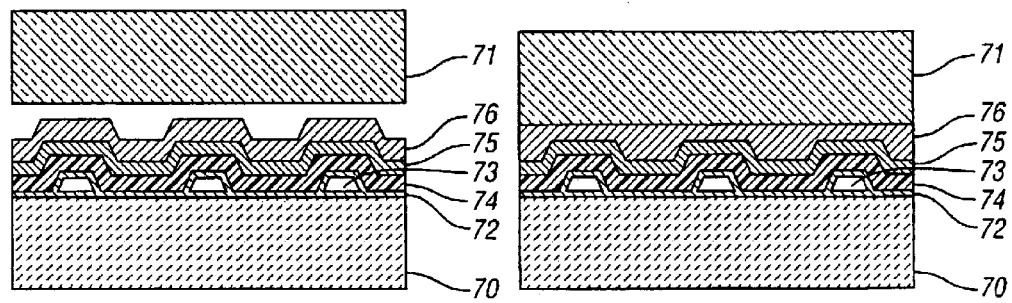
FIGS. 7a and 7b are side schematic views showing electrostatic bonding of glass to Si—Au eutectic solder for hermetic sealing over non-planar interfaces.

FIGS. 7a and 7b show non-planar substructures such as electrical feedthroughs 73 within dielectrics 72 between a silicon wafer 70 and a glass wafer 71. A polysilicon layer 74 is formed thereover as well as tin and gold layers 75 and 76, respectively. The solder bond is illustrated in FIG. 7b which bonds the silicon wafer 70 and the glass wafer 71 after the application of force, heat and an electric field as previously described.

Another variation of hermetic packaging with feedthroughs using this bonding technique that may be explored is the use of evaporated glass over feedthrough materials (e.g. metals). The evaporate glass can then be electrostatically bonded to another wafer using eutectic solder as an intermediate layer.

The need for adhering metals to glass is needed for a number of industrial and aesthetic applications; optical and infrared reflectors and lenses, electrical conduits, fluidic conduits, and decorative uses are a few examples. Using Si—Au eutectic solder, an estimated gold karat weight of 23.28 K is achieved; this may be useful for reflector or decorative uses.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A method of joining an insulator element to a substrate with a molten solder therebetween, the method comprising:
    migrating ions in the insulator element towards a bond interface with a molten solder to oxidize a component of the molten solder to form a chemical bond between the insulator element and the molten solder.

2. The method as claimed in claim 1 wherein the insulator element is a glass element.

3. The method as claimed in claim 2, wherein the substrate is a silicon substrate.

4. The method as claimed in claim 1, wherein the component of the solder is silicon.

5. The method as claimed in claim 4, further comprising placing a source of silicon in close surface contact with the solder to provide a silicon component of the solder.

6. The method as claimed in claim 5, wherein the substrate is a silicon substrate and the source of silicon is the silicon substrate.

7. The method as claimed in claim 5, wherein the source of silicon is a polysilicon layer between the insulator and the substrate.

8. The method as claimed in claim 4, wherein the solder is a silicon-gold solder.

9. The method as claimed in claim 1, wherein the insulator element is a glass wafer and the substrate is a silicon wafer.

10. The method as claimed in claim 1, further comprising placing a source of silicon in close surface contact with a layer of metal between the insulator element and the substrate and heating the source of silicon and the layer of metal until silicon from the source alloys with the metal to form the solder.

11. The method as claimed in claim 10, wherein the substrate is a silicon substrate and the source of silicon is the silicon substrate.

12. The method as claimed in claim 10, wherein the source of silicon is a polysilicon layer between the substrate and the insulator element.

13. The method as claimed in claim 1, further comprising forming feedthroughs on the substrate.

14. A method as claimed in claim 1, wherein the molten solder is a molten eutectic solder.

* * * * *